(12) United States Patent
Wang

(10) Patent No.: US 11,004,946 B2
(45) Date of Patent: *May 11, 2021

(54) FINFET STRUCTURE WITH COMPOSITE GATE HELMET

(71) Applicant: TAIWAN SEMICONDUCTOR MANUFACTURING CO., LTD., Hsinchu (TW)

(72) Inventor: Shih-Wei Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/704,327

(22) Filed: Dec. 5, 2019

(65) Prior Publication Data

US 2020/0111880 A1 Apr. 9, 2020

Related U.S. Application Data

(60) Continuation of application No. 16/511,089, filed on Jul. 15, 2019, now Pat. No. 10,505,004, which is a division of application No. 15/716,722, filed on Sep. 27, 2017, now Pat. No. 10,355,095.

(60) Provisional application No. 62/479,430, filed on Mar. 31, 2017.

(51) Int. Cl.
| | |
|---|---|
| *H01L 29/423* | (2006.01) |
| *H01L 29/78* | (2006.01) |
| *H01L 29/66* | (2006.01) |
| *H01L 29/417* | (2006.01) |

(52) U.S. Cl.
CPC .... *H01L 29/4232* (2013.01); *H01L 29/41791* (2013.01); *H01L 29/66795* (2013.01); *H01L 29/785* (2013.01); *H01L 29/7855* (2013.01); *H01L 2029/7858* (2013.01)

(58) Field of Classification Search
CPC ........... H01L 29/4232; H01L 29/41791; H01L 29/66795; H01L 29/785; H01L 29/7855; H01L 29/7858
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |

(Continued)

*Primary Examiner* — Marc Anthony Armand
(74) *Attorney, Agent, or Firm* — Birch, Stewart, Kolasch & Birch, LLP

(57) ABSTRACT

A semiconductor device includes first and second gate stack, a source/drain contact, and a first gate capping structure. The first gate stack and the second gate stack are over a semiconductor fin. The source/drain contact extends laterally from a first gate spacer of the first gate stack to a second gate spacer of the second gate stack, and extends vertically from a source/drain region in the semiconductor fin to above the source/drain region. The first gate capping structure is atop the first gate stack, and has a greater thickness on the first gate spacer of the first gate stack than on a gate metal of the first gate stack. The thickness is measured in a direction perpendicular to a top surface of the first gate stack.

20 Claims, 12 Drawing Sheets

(56) References Cited

U.S. PATENT DOCUMENTS

| | | | |
|---|---|---|---|
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,893,171 B2 * | 2/2018 | Basker | H01L 29/6656 |
| 2017/0162675 A1 * | 6/2017 | Yim | H01L 21/0217 |
| 2017/0358497 A1 * | 12/2017 | Cheng | H01L 21/823481 |
| 2018/0005904 A1 * | 1/2018 | Lee | H01L 29/7827 |

* cited by examiner

FINFET STRUCTURE WITH COMPOSITE GATE HELMET

RELATED APPLICATIONS

This application is a continuation application of U.S. patent application Ser. No. 16/511,089, filed Jul. 15, 2019, now U.S. Pat. No. 10,505,004, issued Dec. 10, 2019, which is a divisional application of U.S. patent application Ser. No. 15/716,722, filed Sep. 27, 2017, now U.S. Pat. No. 10,355,095, issued Jul. 16, 2019, which claims priority to U.S. Provisional Patent Application Ser. No. 62/479,430, filed Mar. 31, 2017, the entire disclosure of each of which is incorporated herein by reference.

BACKGROUND

The semiconductor integrated circuit (IC) industry has experienced rapid growth. Technological progress in IC manufacture has produced several generations of ICs, and each generation fabricates smaller and more complex circuits than the previous generation. Currently, the semiconductor industry has progressed into nanometer technology nodes for higher device density and better electrical performance, and a variety of challenges from fabrication and design have led semiconductor technologies to three-dimensional designs, such as fin-like field effect transistors (FinFETs). A typical FinFET is fabricated with a thin "fin" protruding from a substrate. The channel of the FinFET is formed in the fin. In addition, a gate is formed to traverse the fin, and therefore a tri-gate structure is fabricated. It is beneficial to have a gate on three sides of the channel that allows the gate to control the channel from several sides. FinFET devices further include strained source/drain features to enhance carrier mobility and improve device performance. However, as device scaling down continues, conventional techniques have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
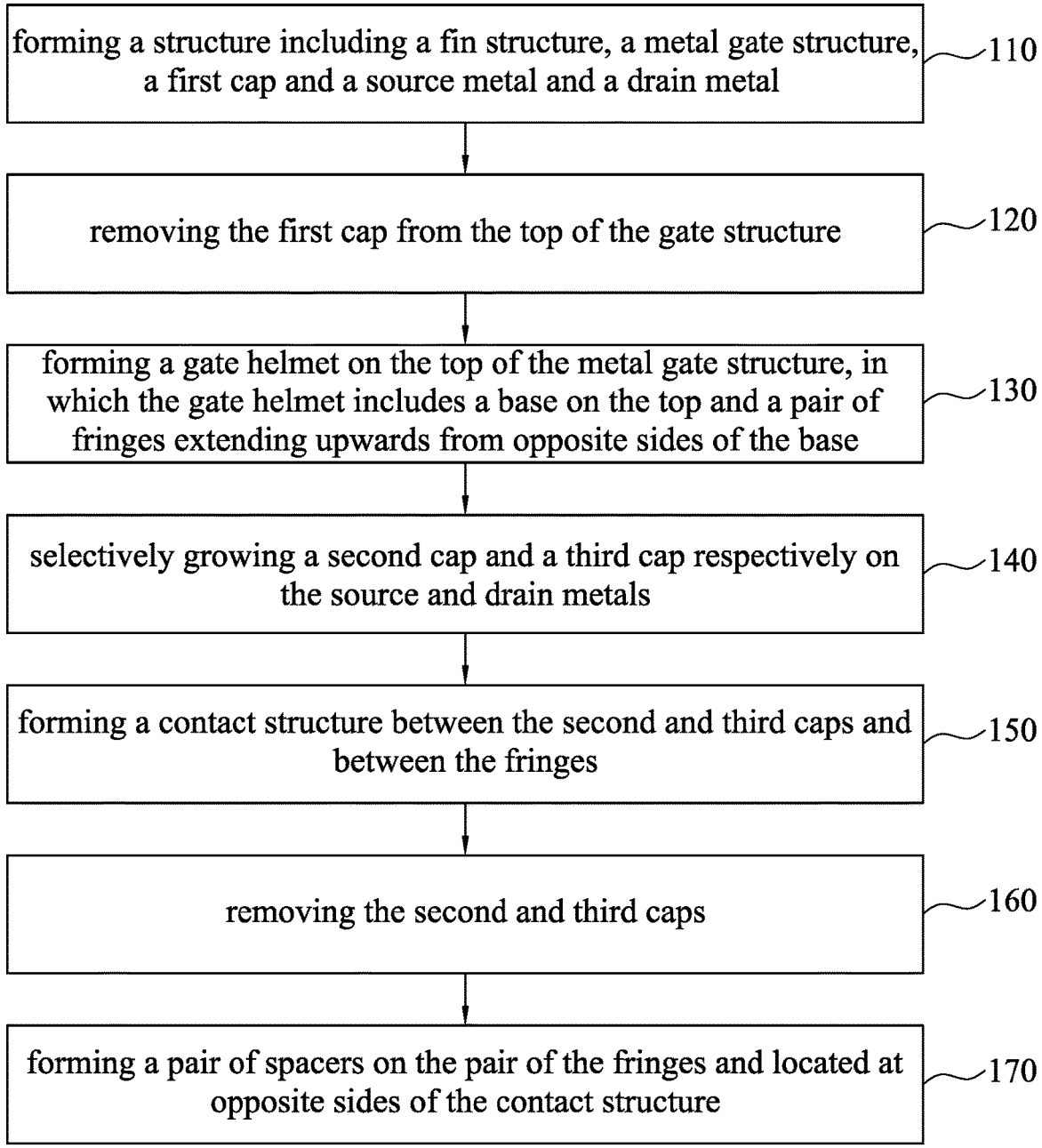
FIG. 1 is a flow chart illustrating a method of forming a semiconductor device according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure relates generally to a semiconductor structure such as for example a FinFET, and a method of manufacturing the semiconductor structure. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

According to various embodiments of the present disclosure, the FinFET disclosed herein has a composite gate helmet, which differs from that in the prior art. Various embodiments of the present disclosure will be described in detail hereinafter.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 3:
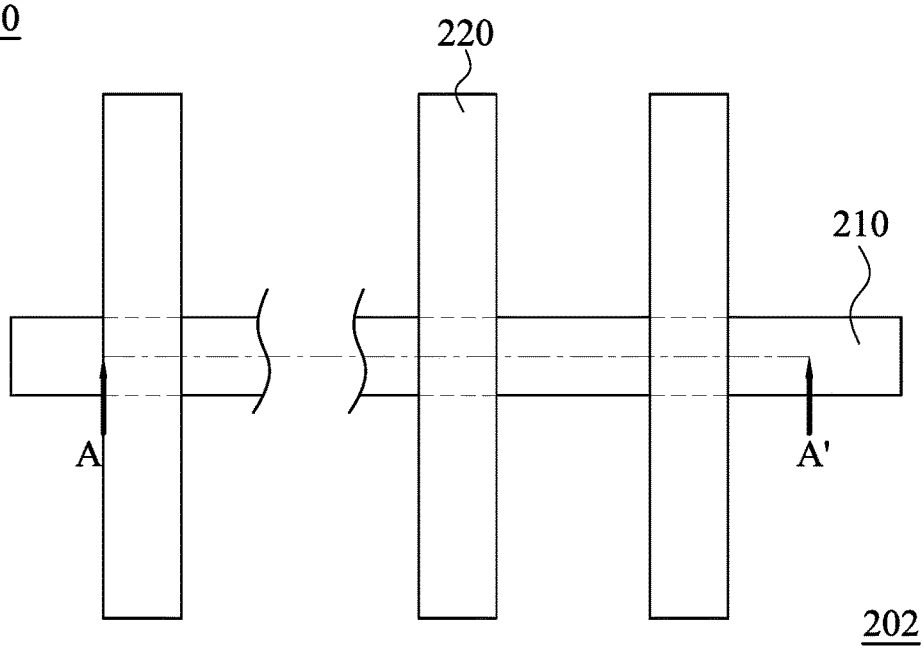
FIG. 3 is top view schematically illustrating a semiconductor device manufactured by the operations in FIG. 1 according to some embodiments.

FIG. 1 is a flow chart illustrating a method 10 of forming a semiconductor device according to various embodiments of the present disclosure. The method 10 includes operation 110, operation 120, operation 130, operation 140, operation 150, operation 160, and operation 170. FIG. 3 is top view schematically illustrating a semiconductor device 200 manufactured by the operations in FIG. 1, and the semiconductor device 200 includes a fin structure 210 and one or more metal gate structures 220 traversing over the fin structure 210. FIGS. 4-22 are cross-sectional views, taken along the line A-A' of FIG. 3, to illustrate more manufacturing details of the method 10 in accordance with various embodiments of the present disclosure. As employed in the present disclosure, the term "semiconductor device 200" refers to a fin field effect transistor (FinFET) and is hereinafter referred to as FinFET 200. The FinFET 200 may refer to any fin-based, multi-gate transistor. Other transistor structures and analogous structures are within the scope of the present disclosure.

It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated acts can be further divided into sub-acts in some implementations, while in other implementations some of the illustrated acts can be carried out concurrently with one another.

Figure 2:
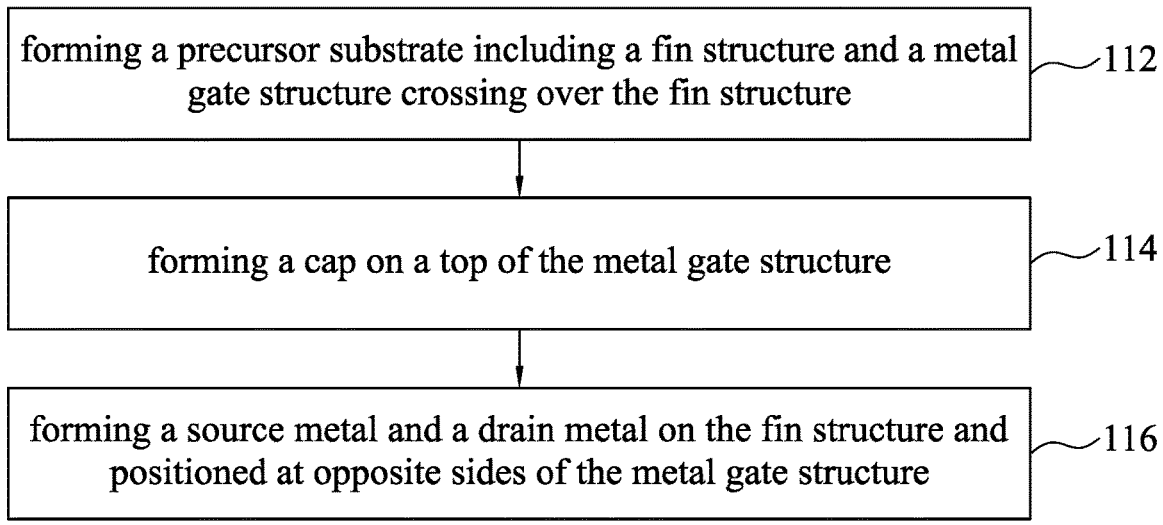
FIG. 2 is a flow chart illustrating an approach to implement the operation 110 in FIG. 1 according to some embodiments.

Referring to FIG. 1, the method 10 begins with operation 110 by forming a structure including a fin structure, a metal gate structure, a first cap and a source metal and a drain metal. FIG. 2 illustrating an approach to implement the operation 110 in a flowchart format according to some embodiments. In addition, FIGS. 4-12 depict cross-sectional views at various fabrication stages in the operation 110, according to some embodiments. It should be noted that the fabrication stages as well as the features shown FIGS. 4-12 are merely examples. A person skilled in the art will recognize there may be many alternatives, variations and modifications.

Figure 4:
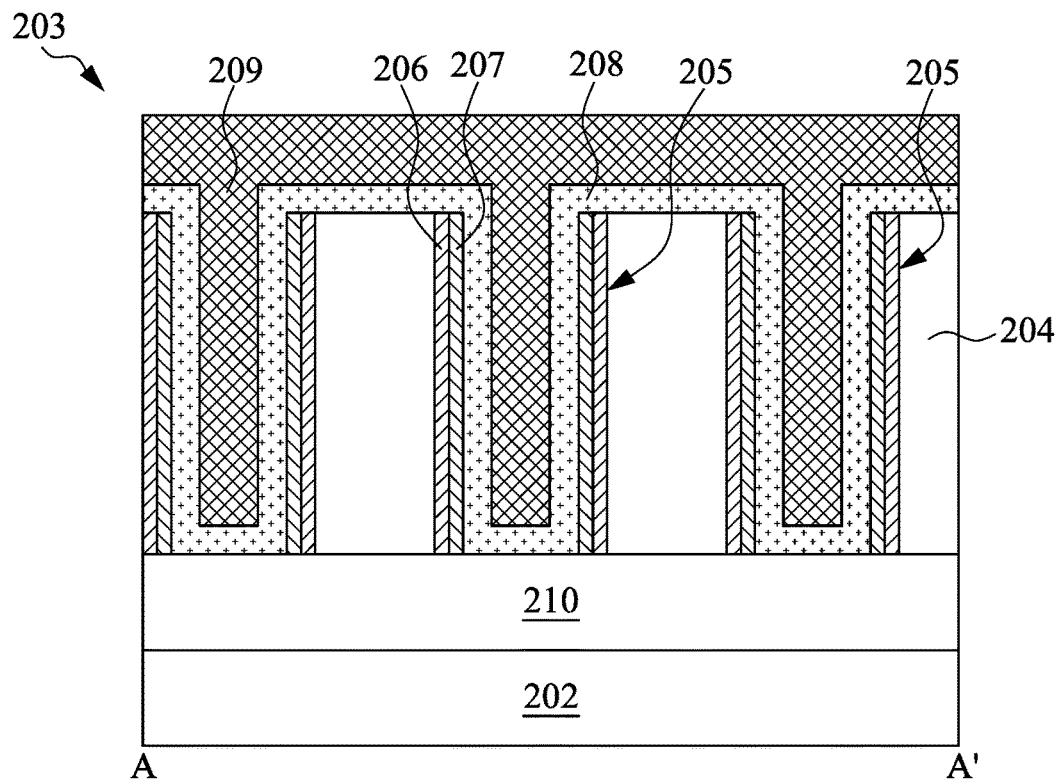
FIGS. 4-22 are cross-sectional views, taken along line A-A' of FIG. 3, illustrating structures at various fabrication stages in accordance with various embodiments of the present disclosure.
Figure 5:
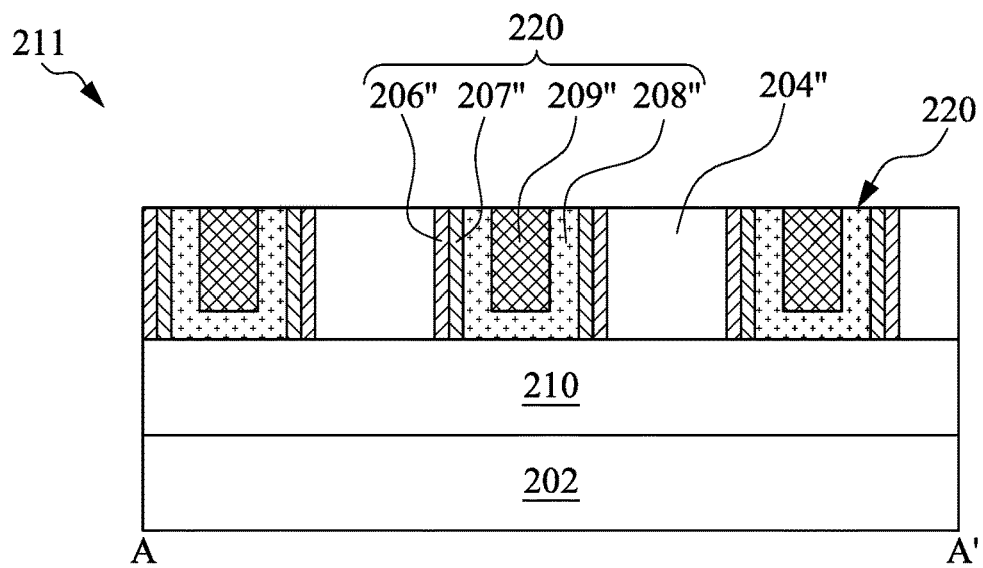

Turning now to FIG. 2, the operation 110 may include an act 112 of forming a precursor substrate including a fin structure and a metal gate structure crossing over the fin structure. FIGS. 4 and 5 illustrate steps of implementing the act 112 according to some embodiments. As depicted in FIG. 4, a precursor substrate 203 is formed. The precursor substrate 203 may be produced by conventional poly-Si gate (e.g., dummy gate) processes of the FinFET fabrication and followed by a metal gate replacement process. Briefly, the precursor substrate 203 includes a fin structure 210 over a substrate 202 and a dielectric layer 204 (e.g., ILD0) over the fin structure 210. The dielectric layer 204 has one or more trenches 205. The precursor substrate 203a further includes spacers 206, 207 on the sidewalls of the trenches 205. The precursor substrate 203a further includes a high dielectric constant layer (HK layer) 208 conformally covering the dielectric layer 204 and the spacers 206, 207. The precursor substrate 203a further includes a metal material layer 209 formed over the HK layer 208 and fills the remained space of the trenches 205. It is noted that the metal material layer 209 shown in FIG. 4 has replaced a poly-Si gate (not shown) previously formed. In various embodiments, the substrate 202 may include a bulk silicon substrate. In yet some embodiments, the substrate 202 may include an elementary semiconductor such as for example germanium or silicon in a crystalline structure. In yet some embodiments, the substrate 202 may include a compound semiconductor such as for example gallium arsenic, silicon carbide, indium phosphide or gallium phosphide, or combinations thereof. In yet some embodiments, the substrate may include an alloy semiconductor such as silicon germanium, silicon germanium carbide, gallium arsenic phosphide, and gallium indium phosphide.

After the precursor substrate 203 depicted in FIG. 4 is formed, a chemical mechanical polishing (CMP) is performed on the metal material layer 209 so as to from another precursor substrate 211, as shown in FIG. 5. The precursor substrate 211 includes the fin structure 210 over the substrate 202 and one or more metal gate structures 220 crossing over the fin structure 210. In examples, each of the metal gate structure 220 includes spacers 206", 207", a HK layer 208" and a metal gate electrode 209", as shown in FIG. 5. The precursor substrate 211 may further includes dielectric 204" between two adjacent metal gate structures 220.

Figure 6:
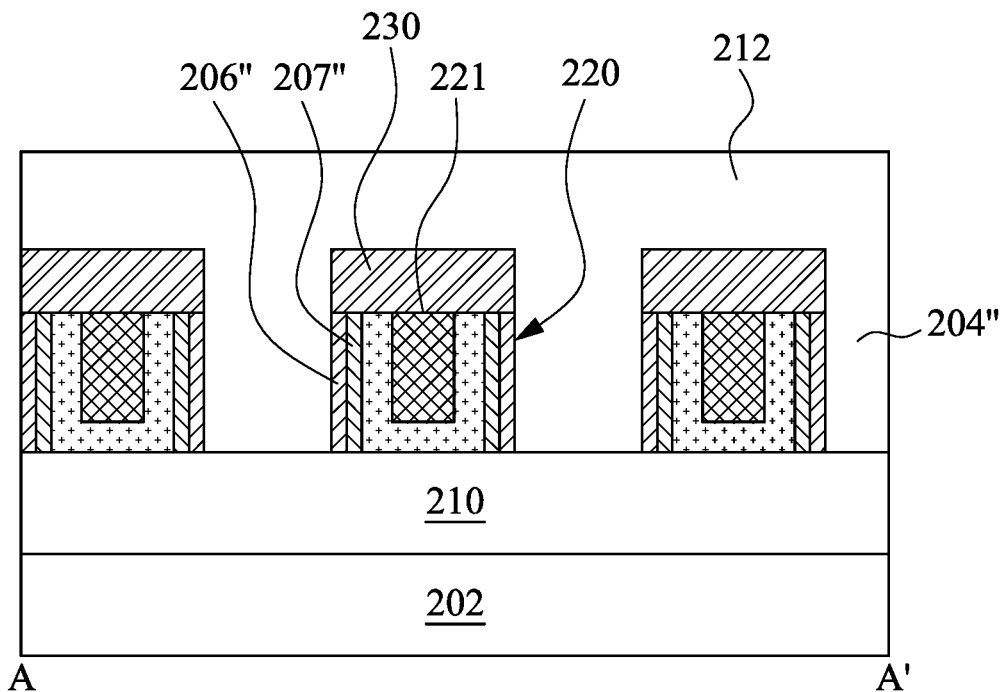
Figure 7:
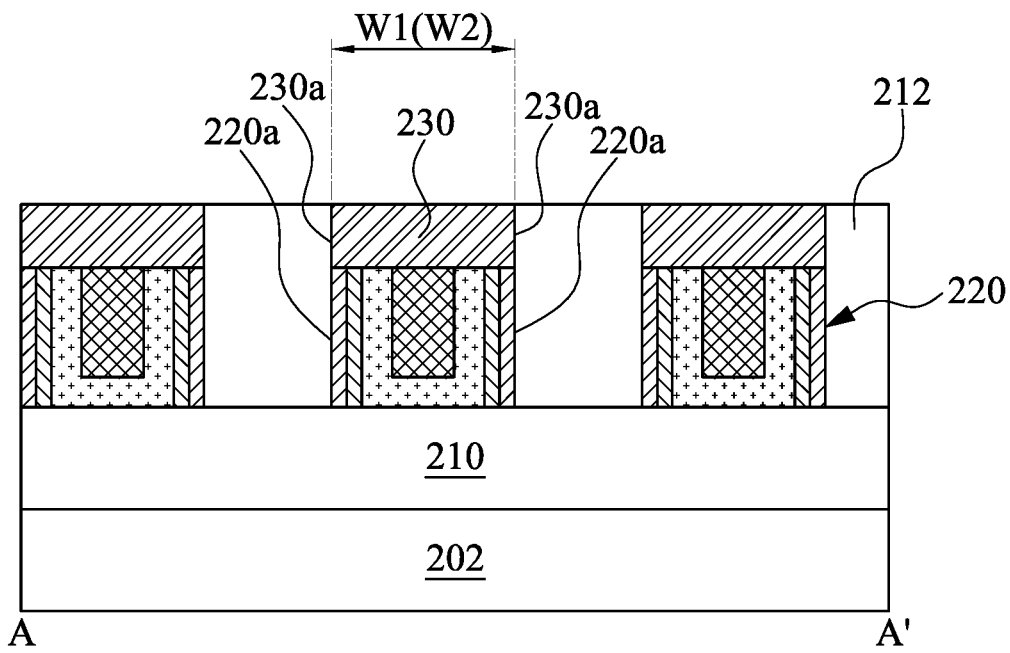

Referring back to FIG. 2, the operation 110 may include an act 114 of forming a cap on a top of the metal gate structure. FIGS. 6 and 7 illustrate detailed steps of implementing the act 114 according to some embodiments. As depicted in FIG. 6, at least one cap 230 is formed on a top 221 of the metal gate structure 220. In some embodiments, a number of caps 230 may be selectively grown on the metal gate structures 220. It is noted that the formation of the cap 230 does not need any photolithographic process according to some embodiments. For example, metal such as tungsten (W) or other metallic materials may be grown on the metal portion of the metal gate structure 220 and continuously grown laterally to cover spacers 206", 207". During the formation of the cap 230, the cap 230 is not grown on the surface of the dielectric 204". After the formation of the cap(s) 230, a dielectric layer 212 may be deposited covering the cap(s) 230 and the metal gate structure(s) 220. Thereafter, as shown in FIG. 7, a chemical mechanical polish (CMP) is performed on the dielectric layer 212 to expose the cap(s) 230 on the metal gate structure(s) 220. Accordingly, the act 114 of forming the cap on the top of the metal gate structure may be implemented. In some embodiments, the edges 230a of the cap 230 are substantially aligned with the edges 220a of the metal gate structure 220. In other word, the width W1 of the cap 230 may be substantially equal to the width W2 of the metal gate structure 220. In examples, the width W1 of the cap 230 is about 80% to 120% of the width W2 of the metal gate structure 220.

Figure 8:
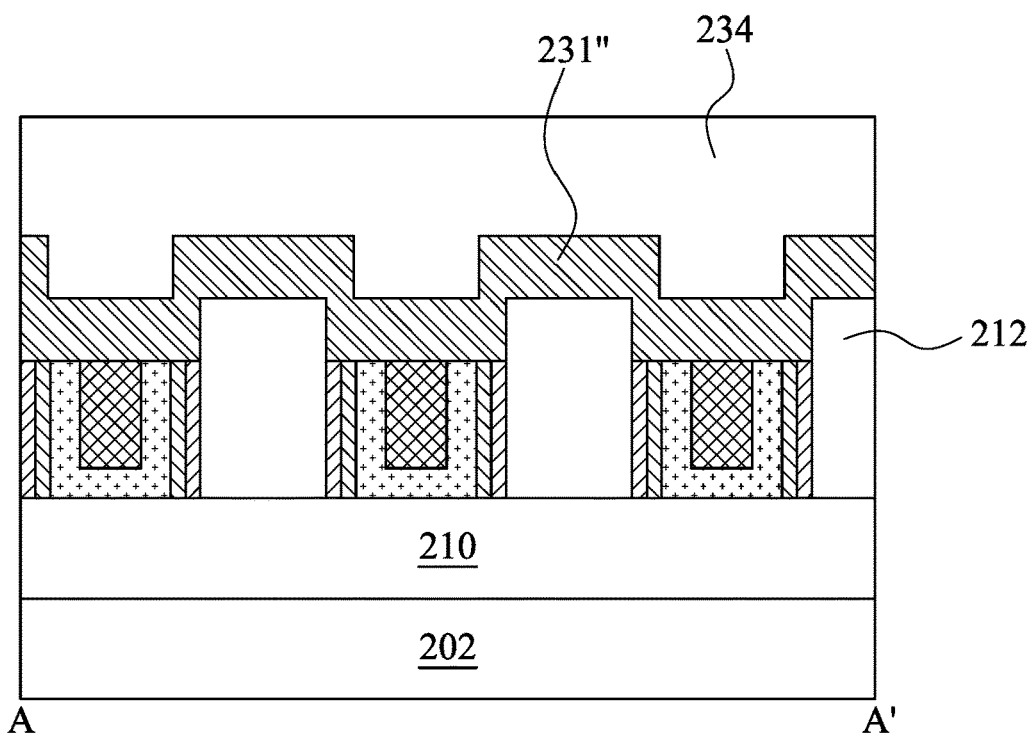
Figure 9:
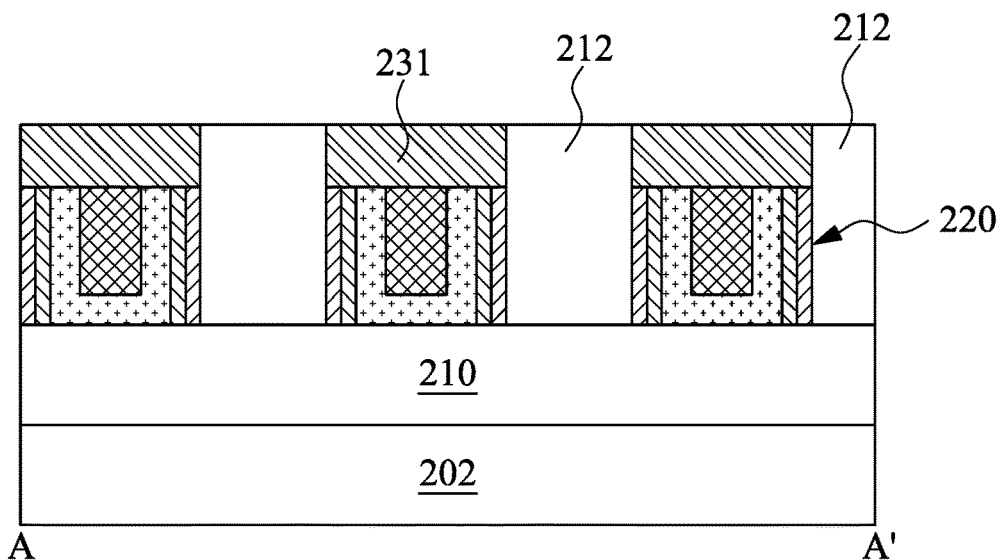

The operation 110 may optionally include a material replacement process in terms of the compatibility of the cap material in the following processes. For example, the cap(s) 230 depicted in FIG. 7 may be completely removed to expose the metal gate structure(s) 220. Thereafter, as shown in FIG. 8, a cap material layer 231" is deposited conformally covering the metal gate structure(s) 220 and the dielectric layer 212, and a sacrificial layer 234 is then formed on the cap material layer 231". The material of the cap material layer 231" is different from that of the cap(s) 230. Subsequently, as illustrated in FIG. 9, a CMP is performed to remove the sacrificial layer 234 and a portion of the cap material layer 231", in which the dielectric layer 212 may be used as a stop layer. Therefore, one or more caps 231 are formed on the metal gate structure(s) 220. The structure in FIG. 9 is substantially the same as that in FIG. 7, but the cap(s) 230 has been replaced by the cap(s) 231. In examples, the cap(s) 231 may include silicon nitride, metal oxides such as zirconium oxide (ZrO) and the likes, or other suitable materials.

Figure 10:
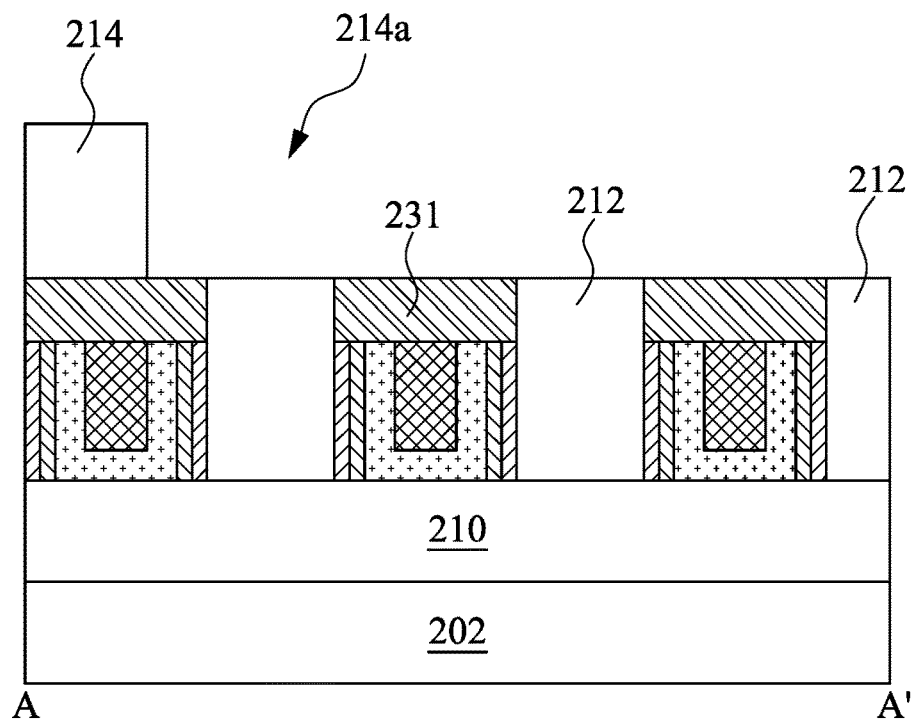
Figure 11:
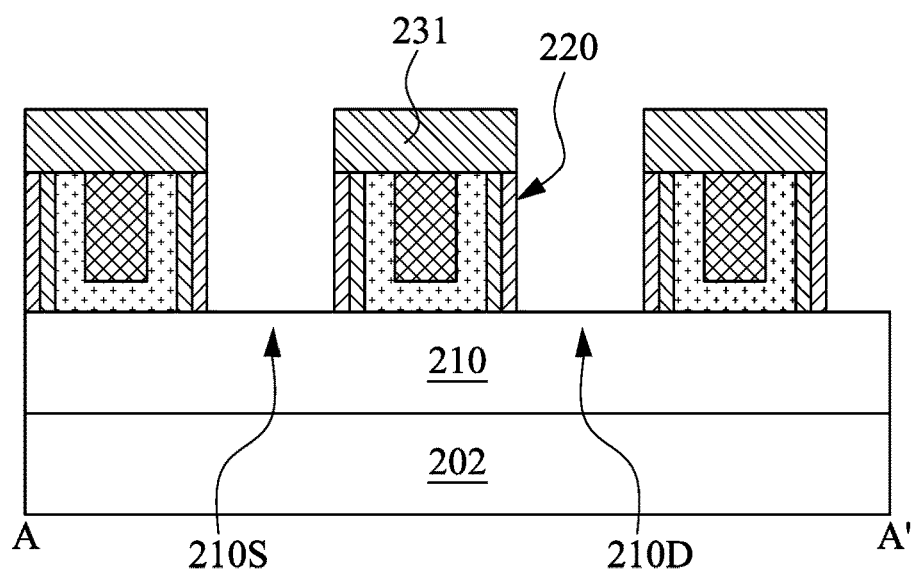

Referring to FIGS. 10 and 11, the operation 110 may further include patterning the dielectric layer 212. In FIG. 10, a masking layer 214 such as a photoresist layer may be formed over the dielectric layer 212. The masking layer 214 has at least one opening 214a, which has a relatively larger dimension as compared to the critical dimension such as the width of the metal gate structure 220. The opening 214a may expose a desired region where source/drain metals will be formed in the following process. Subsequently, as shown in FIG. 11, an etching process may be performed to etch the exposed portion of the dielectric layer 212, which is not covered by the masking layer 213. After performing the etching process, a source region 210S and a drain region 210D of the fin structure 210 are exposed. The masking layer 214 may optionally be removed.

Figure 12:
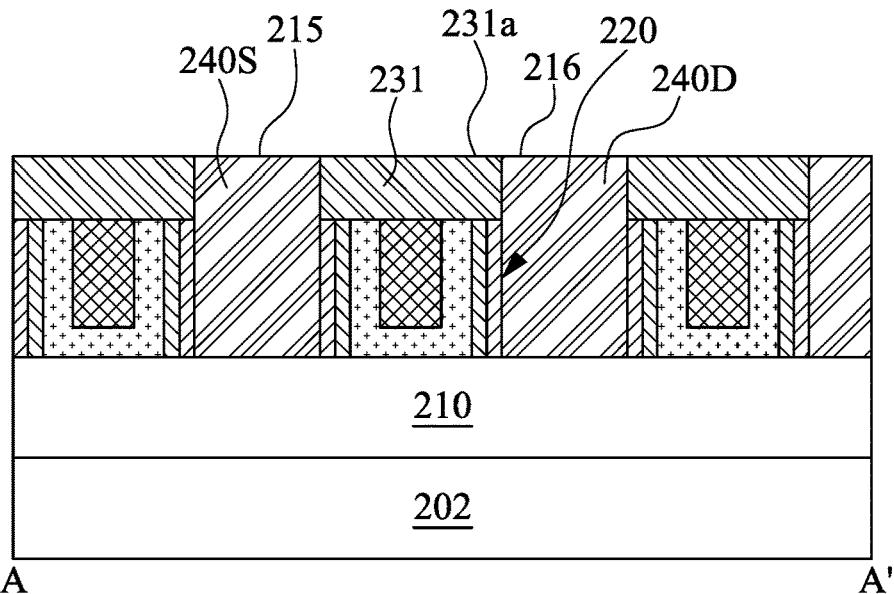

Referring back to FIG. 2, the operation 110 may include an act 116 of forming a source metal and a drain metal on the fin structure and positioned at opposite sides of the metal gate structure. As depicted in FIG. 12, a source metal 240S and a drain metal 240D are formed on the fin structure 210, in which the source and drain metals 240S, 240D are situated at opposite sides of the metal gate structure 220. For example, a metal layer may be deposited covering the cap 231, the metal gate structure 220, and the source and drain regions 210S, 210D of the fin structure 210. Then, a CMP process may be performed to remove portions of the deposited metal layer such that a top surface 231a of the cap 231 is exposed, thereby forming the source and drain metals 240S, 240D.

Therefore, the operation 110 in FIG. 1 may be implemented, as discussed hereinbefore in connection with FIGS. 2 and 4-12. Particularly, as illustrated in FIG. 12, a structure 201 is obtained. The structure 201 includes substrate 202, fin structure 210, at least one metal gate structure 220, at least one cap 231 (hereinafter referred to as first cap 231), source metal 240S, and drain metal 240D. The fin structure 210 protrudes from the substrate 202. The metal gate structure 220 crosses over the fin structure 210. The first cap 231 is disposed on the top of the metal gate structure 220. The source and drain metals 240S, 240D are formed on the fin structure 210 and located at opposite sides of the metal gate structure 220. In some embodiments, the source and drain metals 240S, 240D respectively have top surfaces 215, 216, and the top surfaces 215, 216 are continuous with the top surface 231a of the first cap 231. In examples, the top surfaces 215, 216 of the source and drain metals 240S, 240D are substantially coplanar with the top surface 231a of the first cap 231.

Figure 13:
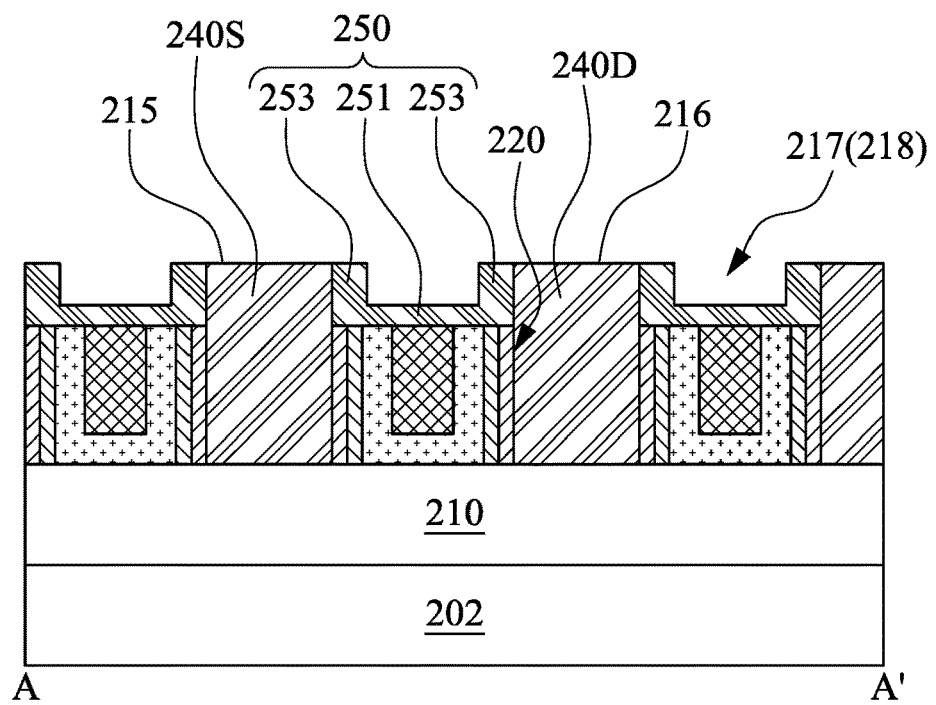

Referring to FIG. 1, the method 10 proceeds to the operation 120 by removing the first cap from the top of the gate structure, and followed by the operation 130 by forming a gate helmet on the top of the metal gate structure. FIG. 13 illustrates the structure after the operation 130 is carried out. In operation 120, the first cap 231 illustrated in FIG. 12 is etched away to expose the metal gate structure 220. In various embodiments, the removable of the first cap 231 includes forming a recess 217 (indicated in FIG. 13) that is recessed from the top surfaces 215, 216 of the source and drain metals 240S, 240D. Subsequently, a gate helmet 250 is formed on the top of the metal gate structure 220 (i.e., in the recess 217). The gate helmet 250, for example, may be formed by conformally depositing a helmet material layer, and followed by a CMP process to remove the portions of the helmet material layer on the source and drain metals 240S, 240D. In embodiments, the gate helmet 250 may include a base 251 and a pair of fringes 253. The base 251 is formed on the top of the metal gate structure 220, and the pair of the fringes 253 extends upwards from opposite sides of the base 251. A recess 218 may be formed in between the pair of the fringes 253. In addition, the pair of fringes 253 is in contact with the sidewalls of source and drain metals 240S, 240D. In some embodiments, the top surfaces 215, 216 of the source and drain metals 240S, 240D are continuous with the tops of the fringes 253. For example, the tops of the fringes 253 are coplanar with the top surfaces 215, 216 of the source and drain metals 240S, 240D. In some examples, the gate helmet 250 is made of a non-metal material such as silicon nitride and the like.

Figure 14:
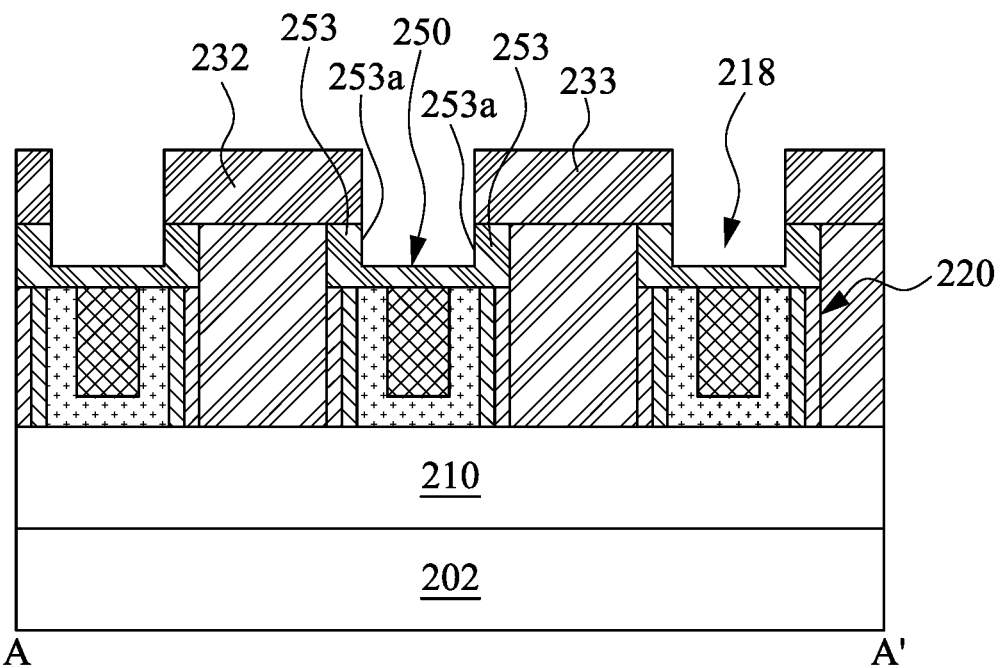

Referring to FIG. 1, the method 10 proceeds to the operation 140 by selectively growing a second cap and a third cap respectively on the source and drain metals. As depicted in FIG. 14, a second cap 232 and a third cap 233 are selectively grown on the source and drain metals 240S, 240D, respectively. In some embodiments, the second cap 232 and the third cap 233 are initially grown only on the source and drain metals 240S, 240D, and then laterally grown to a position over the fringes 253 of the gate helmet 250. In some examples, an alkysilane self-assembled monolayer (alkysilane SAM) is formed on a non-metal surface of the structure depicted in FIG. 13 such as the exposed surface of the gate helmet 250, but is not formed on the source and drain metals 240S, 240D due to the characteristic of the alkysilane SAM. Furthermore, the alkysilane SAM may inhibit the growth of the second and third caps 232, 233 so that the second cap 232 and the third cap 233 are initially grown only on the source and drain metals 240S, 240D. The second cap 232 and the third cap 233 may be made of metal oxide or silicon nitride, for example. The second cap 232 and the third cap 233 are not grown to past the inner edges 253a of the fringes 253. For example, each of the second and third caps 232, 233 has an edge substantially aligned with the inner edges 253a of the pair of the fringes 253.

Figure 15:
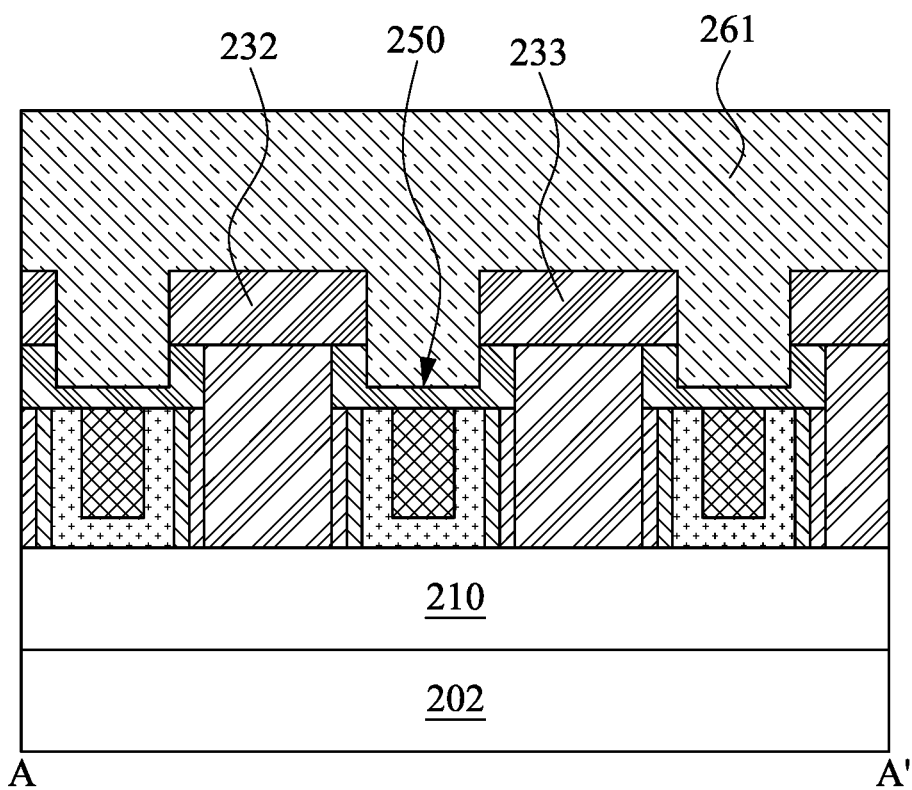
Figure 16:
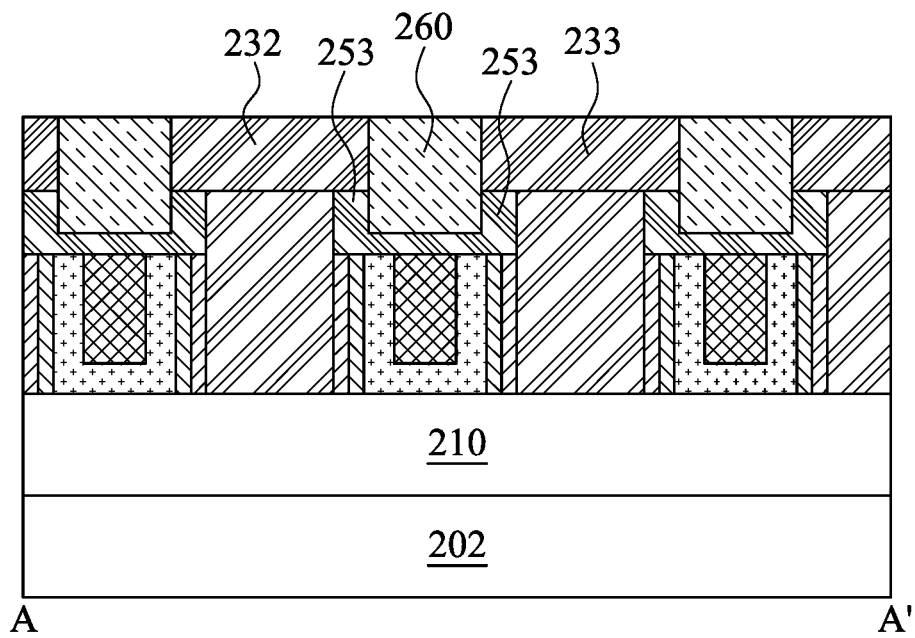

Referring to FIG. 1, the method 10 proceeds to the operation 150 by forming a contact structure between the second and third caps and between the fringes. FIGS. 15 and 16 illustrate the detailed steps of the operation 150 according to some embodiments. As depicted in FIG. 15, a contact material layer 261 is formed over the second cap 232, the third cap 233, and the gate helmet 250. In some embodiments, the contact material layer 261 may be deposited to a sufficient thickness, such that the recess 218 between fringes 253 and the space between the second cap 232 and the third cap 233 are filled. Thereafter, as shown in FIG. 16, a CMP process may be carried out to remove a portion of the contact material layer 261 so that a contact structure 260 may be formed between the second and third caps 232, 233 and in between the pair of the fringes 253. In some examples, contact structure 260 may be made of oxide such as silicon oxide or the like.

Figure 17:
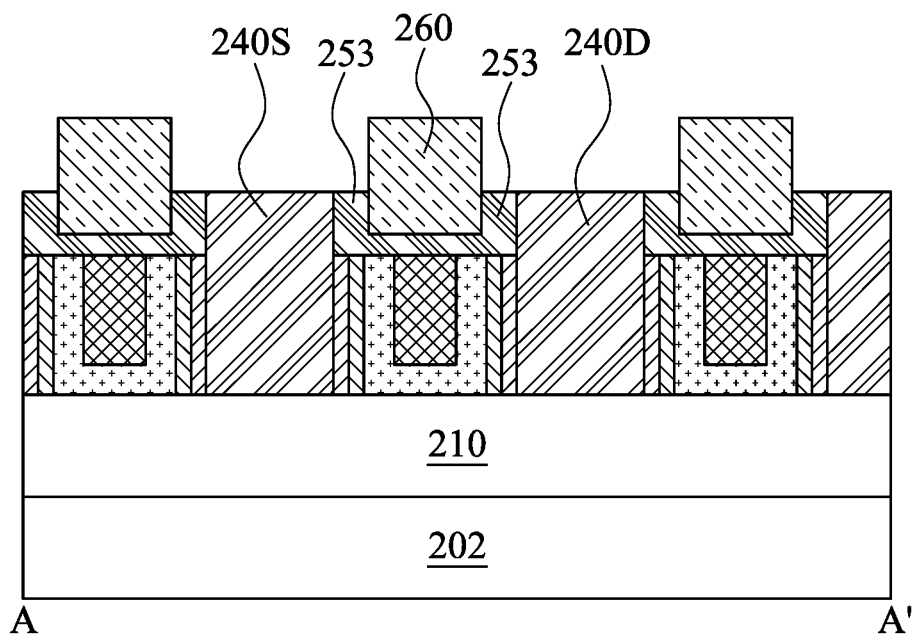

Referring to FIG. 1, the method 10 proceeds to the operation 160 by removing the second and third caps. As depicted in FIG. 17, the second cap 232 and the third cap 233 are removed so that the fringes 253 of the gate helmet 250 are exposed. Further, the source metal 240S and the drain metal 240D are exposed.

Figure 18:
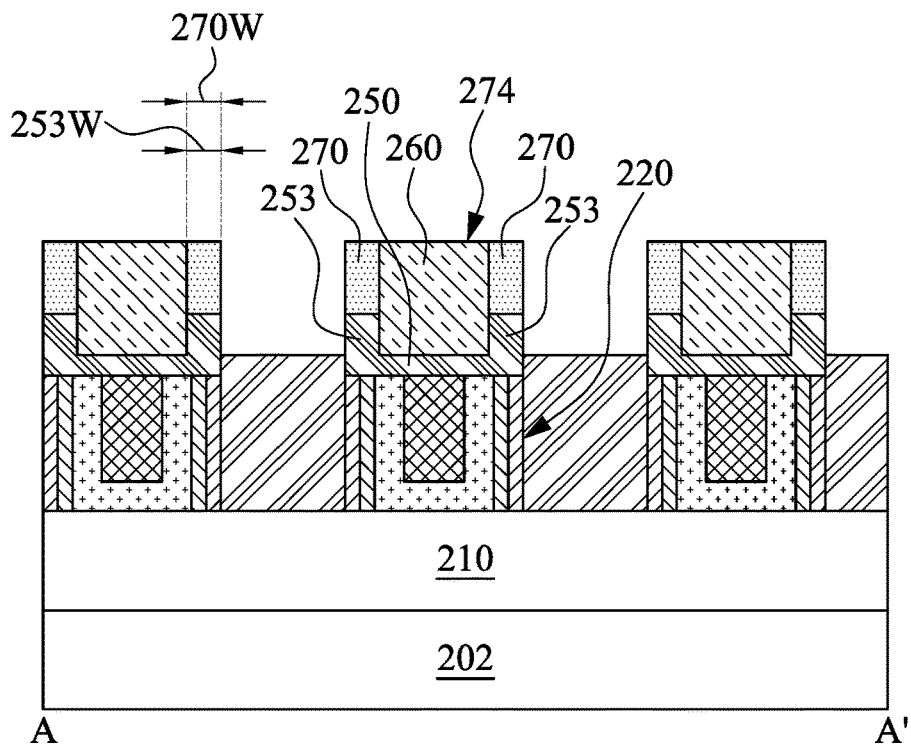

Referring to FIG. 1, the method 10 proceeds to the operation 170 by forming a pair of spacers on the pair of the fringes and located at opposite sides of the contact structure. As depicted in FIG. 18, a pair of spacers 270 is formed on the pair of the fringes 253, in which the pair of spacers 270 is located at opposite sides of the contact structure 260. In some embodiments, the pair of spacers 270 may be formed by conformally depositing a spacer material layer covering the source metal 240S, the drain metal 240D, the fringes 253, and the contact structure 260. Subsequently, an etching process is carried out in a blanket manner to remove the horizontal portions of the spacer material layer. Therefore, the pair of the spacers 270 may be formed at sidewalls of the contact structure 260 and stand on the fringes 253. On each of the metal gate structure 220, the gate helmet 250 (including the pair of the fringes and the base), the contact structure 260 and the pair of the spacers 270 collectively constitute a helmet composite 274. In some embodiments, each of the spacers 270 has a width 270W that is substantially equal to a width 253W of a corresponding one of the fringes 253. Thereafter, another etching process may be optionally performed to etch back the source metal 240S and the drain metal 240D in order to reduce the thickness of the source and drain metals 240S, 240D. In examples, the top surfaces of the etched source and drain metals 240S, 240D are below the tops of the fringes 253 but is higher than the top surface of the metal gate structure 220.

Figure 19:
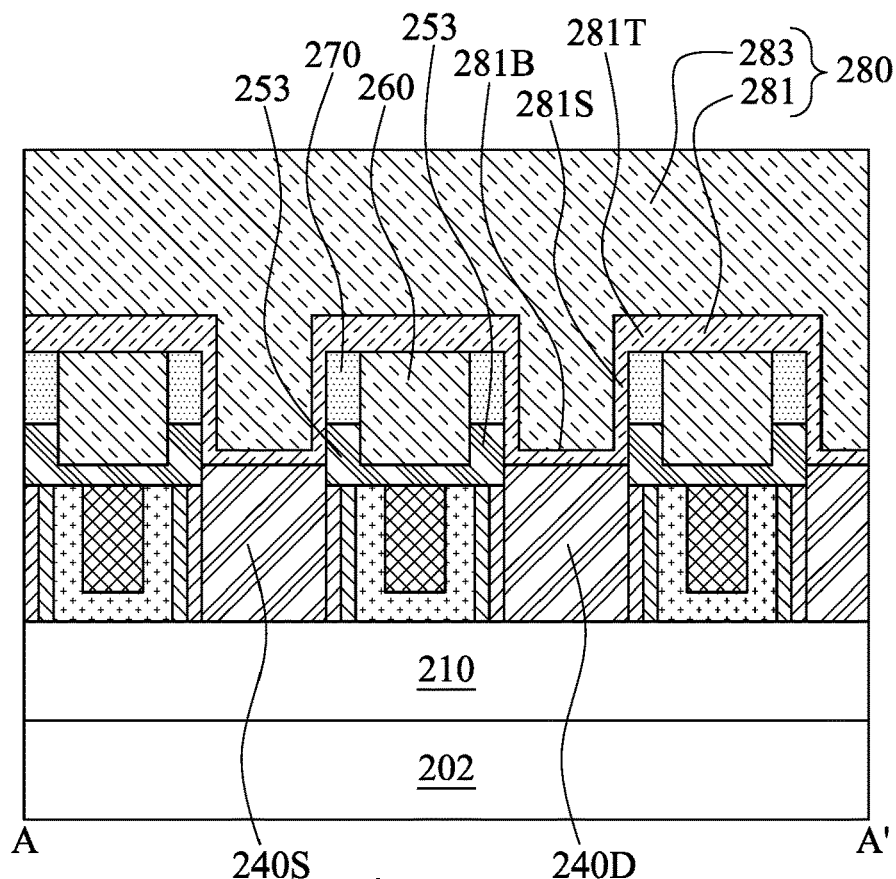

The method 10 may include other operations after the operation 170. FIGS. 19-22 are cross-sectional views illustrating the operations or acts that may be carried out after the operation 170, according to some embodiments. In FIG. 19, a dielectric layer 280 may be formed covering the contact structure 260, the spacers 270, and the source and drain metals 240S, 240D. In some embodiments, the dielectric layer 280 may include a liner layer 281 and a dielectric layer 283. The liner layer 281 may be conformally deposited, and includes a top portion 281T, a side portion 281S, and a bottom portion 281B. The top portion 281T covers the top of contact structure 260 and the top of the spacers 270. The side portion 281S covers the sidewalls of the spacers 270 and the sidewalls of the fringes 253. The bottom portion 281B covers the top surfaces of the source and drain metals 240S, 240D. The liner layer 281, for example, may be made of nitride such as silicon nitride, or materials suitable for contact-etch-stop-layers (CESL), or the like. The material of the dielectric layer 283 is different from that of the liner layer 281. The dielectric layer 283 has a higher etching selectivity than the liner layer 281 for an identical etchant. That is, the etching resistance of the liner layer 281 to the etchant is greater than that of the dielectric layer 283. The dielectric layer 283, for example, may be made of carbon-rich dielectric materials such as SiOC or the like. The dielectric layer 283 may also be referred to as a self-alignment contact layer, which is described in detail hereinafter.

Figure 20:
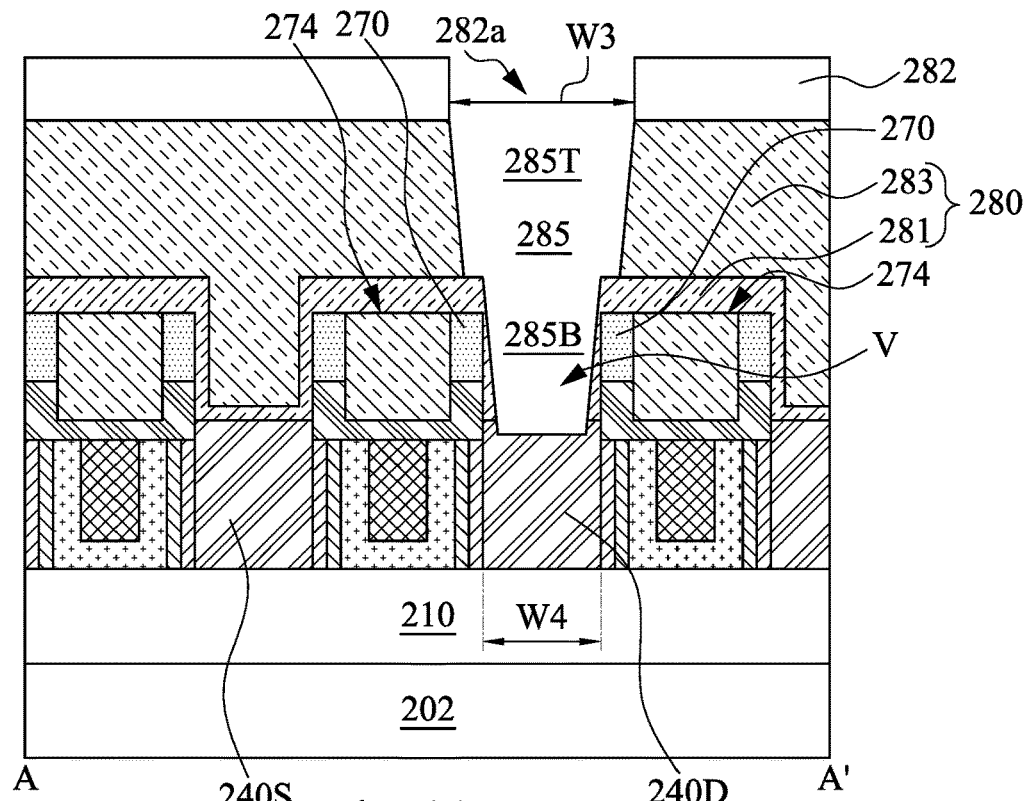

In FIG. 20, a via 285 is formed passing through the dielectric layer 280 to expose at least one of the source and drain metals 240S, 240D. The via 285 is also referred to as a source/drain via 285. In some embodiments, the source/drain via 285 is positioned between two adjacent ones of the helmet composites 274. In examples, the source/drain via 285 may be formed by steps described below. First, a masking layer 282 with an opening 282a is formed on the dielectric layer. The opening 282a exposes a portion of the dielectric layer 283. The opening 282a may have a diameter or width W3 that is greater than a width W4 of the source or drain metals 240S, 240D. An etching process is then performed to etch the exposed portion of the dielectric layer 283, in which the liner layer 281 serves as an etching stop layer. When the etching proceeds to the portion V of the dielectric layer 283 between two adjacent helmet composites 274, the etching is restrained by the side portion 281S (shown in FIG. 19) of liner layer 281 since the etching resistance of the liner layer 281 is greater than that of the dielectric layer. Therefore, the dimension (e.g., diameter or width) of the bottom portion 285B of the source/drain via 285 is smaller than that of the top portion 285T of the source/drain via 285. In other words, the position and dimension of the bottom portion 285B of the source/drain via 285 is not solely dominated by the width W3 of the opening 282a of the masking layer 282, but may be managed by the structure of the helmet composites 274. More significantly, the bottom portion 285B of the via 285 is "self-aligned" with the space between two adjacent helmet composites 274, which is directly over the source or drain metals 240S, 240D. After the etching of the dielectric layer 283, a portion of the liner layer 281 is exposed through the source/drain via 285. A breakthrough process is then carried out to remove the exposed portion of the liner layer 281 in the source/drain via 285. As a result, the drain metal 240D under the liner layer 281 is exposed. In examples, the breakthrough process employs an etchant different from the etchant to etch the dielectric layer 283. After the breakthrough process, the masking layer 282 may be removed. Although FIG. 20 depicts that the source/drain via 285 is formed to expose the drain metal 240D, it should be understood the via 285 may be formed at a position to expose the source metal 240S.

Figure 21:
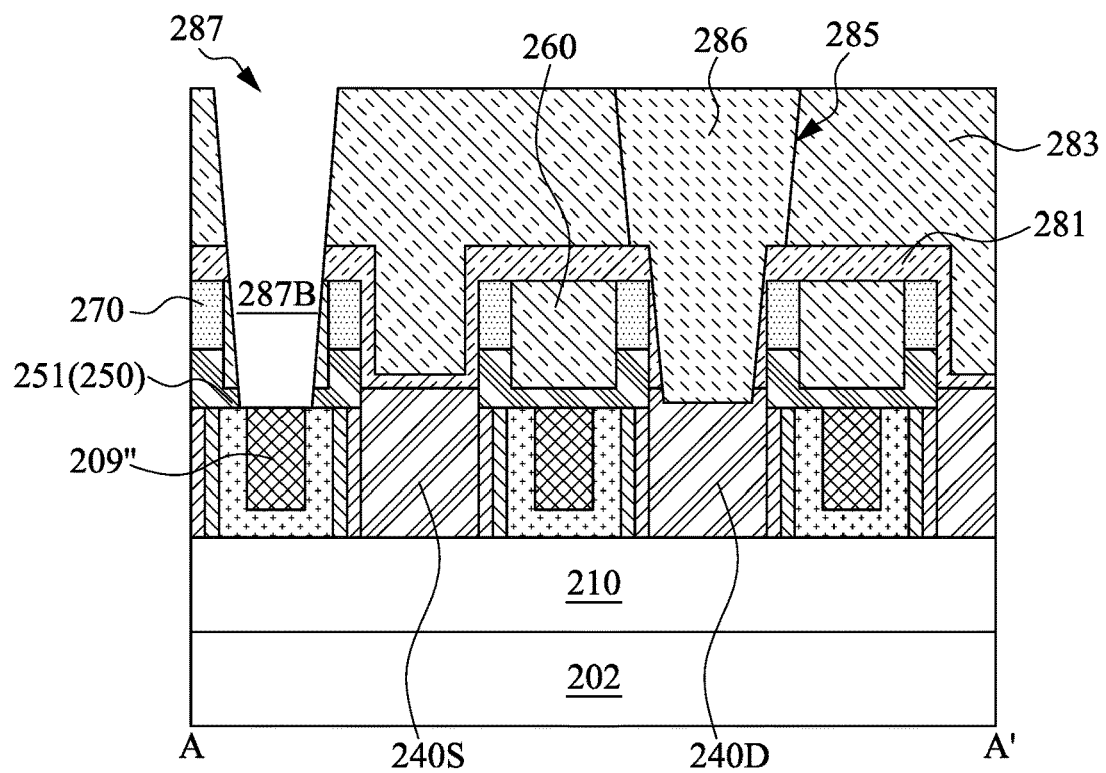

In FIG. 21, the source/drain via 285 is temporarily filled with a filling material 286 such as bottom anti-reflective-coating (BARC) material or the like. Thereafter, a gate via 287 is formed passing through dielectric layer 283, the liner layer 281, the contact structure 260, and the base 251 of the gate helmet 250 so to expose the metal gate electrode 209". In examples, the gate via 287 may be formed by the steps described below. First, a masking layer (not shown in FIG. 21) with an opening (corresponding to gate via 287) is formed on the dielectric layer 283. One or more etching processes are then carried out to form the gate via 287. It is noted that the etching selectivity of the dielectric layer 283, the liner layer 281, the contact structure 260, and/or the gate helmet 250 is higher than that of the spacers 270. That is, the spacers 270 have a greater etching resistance, as compared with the dielectric layer 283, liner layer 281, contact structure 260, and/or gate helmet 250. When the etching proceeds to contact structure 260, the etching is restrained by the spacers 270 positioned at opposite sides of the contact structure 260. Accordingly, the dimension and the position of the bottom portion 287B of the gate via 287 is not solely dominated by the masking layer, but may be managed by the structure of the helmet composites 274. More significantly, the bottom portion 287B of the gate via 287 is "self-aligned" with the contact structure 260, which is directly over the metal gate electrode 209". Therefore, the gate via 287 is formed and the metal gate electrode 209" is exposed.

Figure 22:
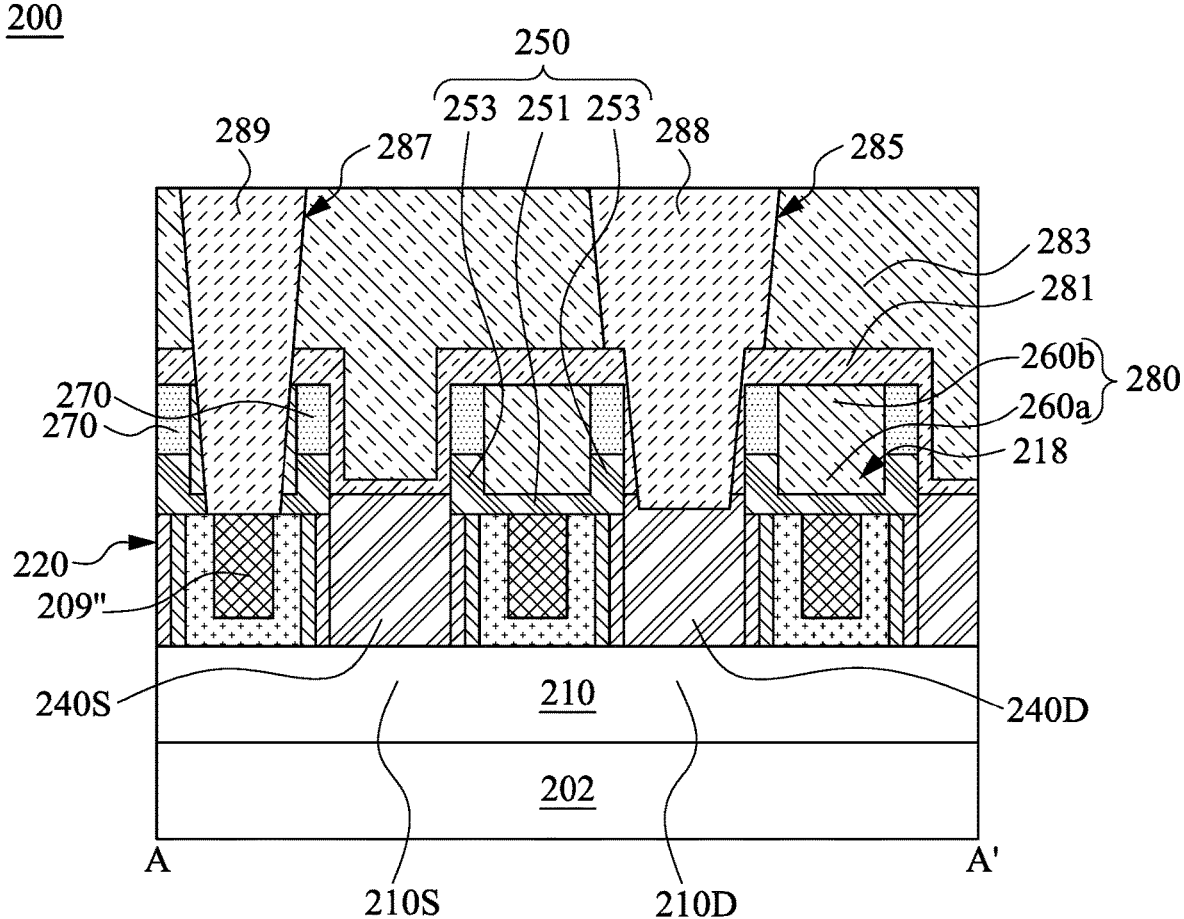

In FIG. 22, the filling material 286 in the source/drain via 285 depicted in FIG. 21 is removed, and then a gate via plug 289 and a source/drain via plug 288 are respectively formed in the gate via 287 and the source/drain via 285. Therefore, metal gate electrode 209" is connected with the gate via plug 289, and the drain metal 240D is connected with the source/drain via plug 288.

The method described hereinbefore is advantageous in that: (i) self-aligned etching is used in forming the source/drain via and the gate via with well-protective spacers, and therefore the isolation concern and the misalignment issues of photo processes are prevented; (ii) the formation of the metal gate electrode does not require any etching back process, and therefore the antenna profile issue is avoided; (iii) the gate helmet (or the helmet composite) is formed after forming the gate structure, and therefore the aspect ratio of the gate stack is reduced; and (iv) the self-aligned structure are used to form both the gate vias and source/drain vias, so the density of the vias may be increased.

According to some embodiments of the present disclosure, the method includes the following operations: (i) forming a precursor substrate 211 including a fin structure 210 protruding from a substrate 202, a metal gate structure 220 crossing over the fin structure 210, as shown in FIG. 5;

(ii) forming a first cap 230 on a top of the metal gate structure 220, as shown in FIG. 7; (iii) forming a source metal 240S and a drain metal 240D on the fin structure 210 and positioned at opposite sides of the metal gate structure 220, as shown in FIG. 12; (iv) removing the first cap to expose the top of the metal gate structure 220; (v) as shown in FIG. 13, forming a gate helmet 250 on the top of the metal gate structure 220, in which the gate helmet 250 includes a base 251 on the top and a pair of fringes 253 extending upwards from opposite sides of the base 251; (vi) selectively growing a second cap 232 and a third cap 233 respectively from the source and drain metal 240S, 240D, as shown in FIG. 14; (vii) forming a contact structure 260 between the second and third caps 232, 233 and between the fringes 253, as shown in FIG. 16; (viii) removing the second and third caps 232, 233, as shown in FIG. 17; (ix) forming a pair of spacers 270 on the pair of the fringes 253 and located at opposite sides of the contact structure 260, as shown in FIG. 18; (x) forming a dielectric layer 280 covering the contact structure 260, the spacers 270, and the source and drain metals 240S, 240D, as shown in FIG. 19; (xi) forming a via 285 passing through the dielectric layer 280 to expose at least one of the source and drain metals 240S, 240D, as shown in FIG. 20; (xii) forming a gate via 287 passing through the dielectric layer 280, the contact structure 260, and the base 251 of the gate helmet 250, as shown in FIG. 21; and (xiii) forming a gate via plug 289 and a source/drain via plug 288 respectively in the gate via 287 and the source/drain via 285, as shown in FIG. 22.

According to another aspect of the present disclosure, a semiconductor device such as for example a FinFET device is provided. FIG. 22 also illustrates a cross-sectional view of a FinFET device 200 according to various embodiments of the present disclosure. The FinFET device 200 includes a fin structure 210, at least a gate structure 220, at least a gate helmet 250, at least a contact structure 260, and at least a pair of spacers 270.

The fin structure 210 protrudes from a semiconductor substrate 202, and the gate structure 220 crosses over the fin structure 210. The fin structure 210 includes a source region 210S and a drain region 210D located at opposite sides of the gate structure 220. The gate structure 220 separates the source region 210S from the drain region 210D. The fin structure 210 includes a channel region between the source region 210S and the drain region 210D.

The gate helmet 250 includes a base 251 and a pair of fringes 253. The base 251 is disposed on a top surface of the gate structure 220. The pair of fringes 253 extends upwards from opposite sides of the base 251. The gate helmet 250 has a recess 218 formed between the pair of the fringes 253.

The pair of spacers 270 is positioned on the pair of the fringes 253, and located at opposite sides of the contact structure 260. In some embodiments, each of the spacers 270 has a width 270W (indicated in FIG. 18) that is substantially equal to a width 253W of a corresponding one of the fringes 253. In yet some embodiments, at least one of the spacers 270 has a top surface continuous with a top surface of the contact structure 260.

The contact structure 260 is disposed between the pair of the fringes 253 and between the pair of the spacers 270. In some embodiments, the contact structure 260 includes a first portion 260a and a second portion 260b. The first portion 260a is filled in the recess 218 between the pair of the fringes 253. The second portion 260b is extended upwards from the first portion 260a and between the pair of the spacers 270.

According to some embodiments, the FinFET device 200 further includes a source metal 240S (also referred to as a source contact) and a drain metal 240D (also referred to as a drain contact). The source metal 240S and drain metal 240D are respectively disposed on the source region 210S and the drain region 210D of the fin structure 210.

According to some embodiments, the FinFET device 200 further includes a liner layer 281 and a dielectric layer 283. The liner layer 281 is disposed over the pair of the spacers 270 and the contact structure 260. The dielectric layer 283 is formed over the liner layer 281.

According to some embodiments, the FinFET device 200 further includes a gate via plug 289, which passes through the base 251 of the gate helmet 250, the contact structure 260, the liner layer 281 and the dielectric layer 283. The gate via plug 289 is in contact with the gate electrode of the gate structure 220.

According to some embodiments, the FinFET device 200 further includes a source/drain via plug 288, which passes through both the liner layer 281 and the dielectric layer 283 so that the source via plug 288 is in contact with at least one of the source metal 240S and drain metal 240D.

In accordance with some embodiments, a semiconductor device includes first and second gate stack, a source/drain contact, and a first gate capping structure. The first gate stack and the second gate stack are over a semiconductor fin. The source/drain contact extends laterally from a first gate spacer of the first gate stack to a second gate spacer of the second gate stack, and extends vertically from a source/drain region in the semiconductor fin to above the source/drain region. The first gate capping structure is atop the first gate stack, and has a greater thickness on the first gate spacer of the first gate stack than on a gate metal of the first gate stack. The thickness is measured in a direction perpendicular to a top surface of the first gate stack.

In accordance with some embodiments, a semiconductor device includes a source/drain region, a source/drain contact, a first gate stack, and a source/drain via plug. The source/drain region is in a semiconductor fin. The source/drain contact is over the source/drain region. The first gate stack has a gate spacer in contact with a first sidewall of the source/drain contact. The source/drain via plug is over the source/drain contact. The source/drain via plug has a stepped sidewall structure that comprises a lower sidewall inclined with respect to the first sidewall of the source/drain contact, an upper sidewall inclined with respect to the first sidewall of the source/drain contact, and an intermediary surface connecting the upper sidewall to the lower sidewall.

In accordance with some embodiments, a semiconductor device includes a semiconductor fin, a gate stack, a gate capping structure, an oxide structure, and first and second spacers. The semiconductor fin extends along a first direction above a substrate. The gate stack extends across the semiconductor fin along a second direction perpendicular to the first direction. The gate capping structure has a horizontal portion extending along a top surface of the gate stack, and first and second vertical portions extending upwardly from the horizontal portion. The oxide structure has a lower portion embedded in the gate capping structure. The first and second spacers are on either side of an upper portion of the oxide structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first gate stack and a second gate stack over a semiconductor fin;
   a source/drain contact extending laterally from a first gate spacer of the first gate stack to a second gate spacer of the second gate stack, and extending vertically from a source/drain region in the semiconductor fin to above the source/drain region; and
   a first gate capping structure atop the first gate stack, the first gate capping structure having a greater thickness on the first gate spacer of the first gate stack than on a gate metal of the first gate stack, the thickness being measured in a direction perpendicular to a top surface of the first gate stack.

2. The semiconductor device of claim 1, wherein the source/drain contact has a topmost position higher than a bottom surface of the first gate capping structure.

3. The semiconductor device of claim 2, wherein the topmost position of the source/drain contact is lower than a topmost position of the first gate capping structure.

4. The semiconductor device of claim 1, further comprising:
   a source/drain via plug extending from within the source/drain contact to a position above the source/drain contact.

5. The semiconductor device of claim 4, wherein the source/drain via plug has a stepped sidewall structure comprising a lower sidewall, an upper sidewall, and an intermediary surface connecting the upper sidewall to the lower sidewall, and the intermediary surface is directly above the first gate capping structure.

6. The semiconductor device of claim 5, wherein the lower sidewall of the stepped sidewall structure of the source/drain via plug is inclined with respect to a sidewall of the source/drain contact.

7. The semiconductor device of claim 5, wherein the upper sidewall of the stepped sidewall structure of the source/drain via plug is inclined with respect to a sidewall of the source/drain contact.

8. The semiconductor device of claim 1, further comprising:
   an oxide structure having a lower portion embedded in the first gate capping structure; and
   a plurality of spacers alongside an upper portion of the oxide structure.

9. The semiconductor device of claim 1, further comprising:
   a second gate capping structure atop the second gate stack, wherein the second gate capping structure has a greater thickness on the second gate spacer of the second gate stack than on a gate metal of the second gate stack, and the thickness of the second gate capping structure is measured in a direction perpendicular to a top surface of the second gate stack.

10. The semiconductor device of claim 9, wherein a topmost position of the first gate capping structure is substantially level with a topmost position of the second gate capping structure.

11. A semiconductor device, comprising:
    a source/drain region in a semiconductor fin;
    a source/drain contact over the source/drain region;
    a first gate stack having a gate spacer in contact with a first sidewall of the source/drain contact; and
    a source/drain via plug over the source/drain contact, the source/drain via plug having a stepped sidewall structure that comprises a lower sidewall inclined with respect to the first sidewall of the source/drain contact, an upper sidewall inclined with respect to the first sidewall of the source/drain contact, and an intermediary surface connecting the upper sidewall to the lower sidewall.

12. The semiconductor device of claim 11, further comprising:
    a gate capping structure over the first gate stack;
    an oxide structure partially inlaid in the gate capping structure;
    a plurality of spacers on either side of the oxide structure; and
    a liner layer wrapping around the spacers, the oxide structure and the gate capping structure.

13. The semiconductor device of claim 12, wherein the source/drain via plug butts against the liner layer.

14. The semiconductor device of claim 12, wherein a portion of the liner layer adjacent the lower sidewall of the source/drain via plug has a trapezoidal cross-section.

15. The semiconductor device of claim 11, further comprising:
    a second gate stack having a gate spacer in contact with a second sidewall of the source/drain contact opposite the first sidewall of the source/drain contact.

16. A semiconductor device, comprising:
    a semiconductor fin extending along a first direction above a substrate;
    a gate stack extending across the semiconductor fin along a second direction perpendicular to the first direction;
    a gate capping structure having a horizontal portion extending along a top surface of the gate stack, and first and second vertical portions extending upwardly from the horizontal portion;
    an oxide structure having a lower portion embedded in the gate capping structure; and
    first and second spacers on either side of an upper portion of the oxide structure.

17. The semiconductor device of claim 16, wherein the first and second spacers respectively cap the first and second vertical portions of the gate capping structure.

18. The semiconductor device of claim 16, further comprising:
    a gate via plug extending upwardly from the gate stack through the gate capping structure and the oxide structure to a position higher than the oxide structure.

19. The semiconductor device of claim 18, wherein the gate via plug is laterally spaced from the first and second spacers.

20. The semiconductor device of claim 18, wherein the gate via plug is laterally spaced from the first and second vertical portions of the gate capping structure.